(12) United States Patent  (10) Patent No.: US 8,420,480 B2
Smith  (45) Date of Patent: Apr. 16, 2013

(54) PATTERNING A GATE STACK OF A NON-VOLATILE MEMORY (NVM) WITH FORMATION OF A GATE EDGE DIODE

(75) Inventor: Bradley P. Smith, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 185 days.

(21) Appl. No.: 13/077,581

(22) Filed: Mar. 31, 2011

(65) Prior Publication Data

US 2012/0252177 A1    Oct. 4, 2012

(51) Int. Cl.
*H01L 21/336* (2006.01)
*H01L 21/8234* (2006.01)

(52) U.S. Cl.
USPC .......................................... 438/257; 438/237

(58) Field of Classification Search .................. None
See application file for complete search history.

(56) References Cited

U.S. PATENT DOCUMENTS

| | | | |
|---|---|---|---|
| 6,424,568 | B2 | 7/2002 | Ahn |
| 6,664,168 | B1 | 12/2003 | Andideh et al. |
| 6,716,694 | B2 | 4/2004 | Yamada |
| 6,898,069 | B2 | 5/2005 | Yamaguchi et al. |
| 7,560,763 | B2 | 7/2009 | Ikegami |
| 2004/0072397 | A1 | 4/2004 | Lowe et al. |
| 2005/0093050 | A1 | 5/2005 | Rost et al. |
| 2006/0024893 | A1 | 2/2006 | Min et al. |
| 2006/0292815 | A1 | 12/2006 | Roberts et al. |

FOREIGN PATENT DOCUMENTS

| | | |
|---|---|---|
| WO | 2006023026 A2 | 3/2006 |
| WO | 2007001783 A2 | 4/2007 |
| WO | 2009120407 A2 | 10/2009 |

OTHER PUBLICATIONS

Richier et al.; "Investigation on Different ESD Protection Strategies Devoted to 3.3 V RF Applications (2Ghz) in a 0.18um CMOS Process"; EOS/ESD Symposium; Sep. 2000; pp. 3A.2.1-3A.2.9; IEEE.
Salman et al.: "SOI Lateral Diode Optimization for ESD Protection in 130nm and 90nm Technologies";EOS/ESD Symposium; Sep. 2005; 7 Pages; IEEE.
Voldman et al.: "Electrostatic Discharge Protection in Silicon-on-Insulator Technology"; IEEE International SOI Conference; Oct. 1999; pp. 68-71; IEEE.

*Primary Examiner* — Scott B Geyer
(74) *Attorney, Agent, or Firm* — Johanna G. Chiu; James L. Clingan, Jr.

(57) ABSTRACT

A gate-edge diode is made in a diode region of a substrate and a non-volatile memory cell is made in an NVM region of the substrate. A first dielectric layer is formed on the substrate in the diode region and the NVM region. A first conductive layer is formed on the first dielectric layer. A second dielectric layer is formed on the first conductive layer. A second conductive layer is formed over the second dielectric layer. A first mask is formed over the diode region having a first pattern. The first pattern is of a plurality of fingers and a second mask over the NVM region has a second pattern. The second pattern is of a gate stack of the non-volatile memory cell. An etch is performed through the second conductive layer, the second dielectric layer, and the first conductive layer to leave the first pattern of the plurality of fingers in the diode region and the second pattern of the gate stack in the NVM region. An implant is performed using the gate stack and the plurality of fingers as a mask to provide source/drain regions adjacent to the gate stack in the NVM region and diode terminals between the fingers in the diode region to form the gate-edge diode with the diode terminals and the substrate.

20 Claims, 6 Drawing Sheets

PATTERNING A GATE STACK OF A NON-VOLATILE MEMORY (NVM) WITH FORMATION OF A GATE EDGE DIODE

CROSS-REFERENCE TO RELATED APPLICATION(S)

This application is related to U.S. patent application Ser. No. 13/077/569, filed on even date, entitled "PATTERNING A GATE STACK OF A NON-VOLATILE MEMORY (NVM) WITH FORMATION OF A METAL-OXIDE-SEMICONDUCTOR FIELD EFFECT TRANSISTOR (MOSFET)," naming Bradley P. Smith, and James W. Miller as inventors, and assigned to the current assignee hereof, and to U.S. patent application Ser. No. 13/077,563, filed on even date, entitled "PATTERNING A GATE STACK OF A NON-VOLATILE MEMORY (NVM) WITH FORMATION OF A CAPACITOR," naming Bradley P. Smith, and Mehul D. Shroff, as inventors, and assigned to the current assignee hereof.

BACKGROUND

1. Field

This disclosure relates generally to non-volatile memories (NVMs), and more specifically, to patterning gate stacks of the NVMs.

2. Related Art

Gate stacks of NVM bit cells often include two layers of conductive material and either one of those conductive layers is also used for forming logic circuits or other circuits. Typically, both layers of conductive material are etched using a same mask to form the gate stack. During the etch of the two conductive materials of the NVM gate stack, end point detection is important in order to prevent over etching. Such an over etch may reduce the reliability and/or increase variability of the NVM array.

Figure 1:
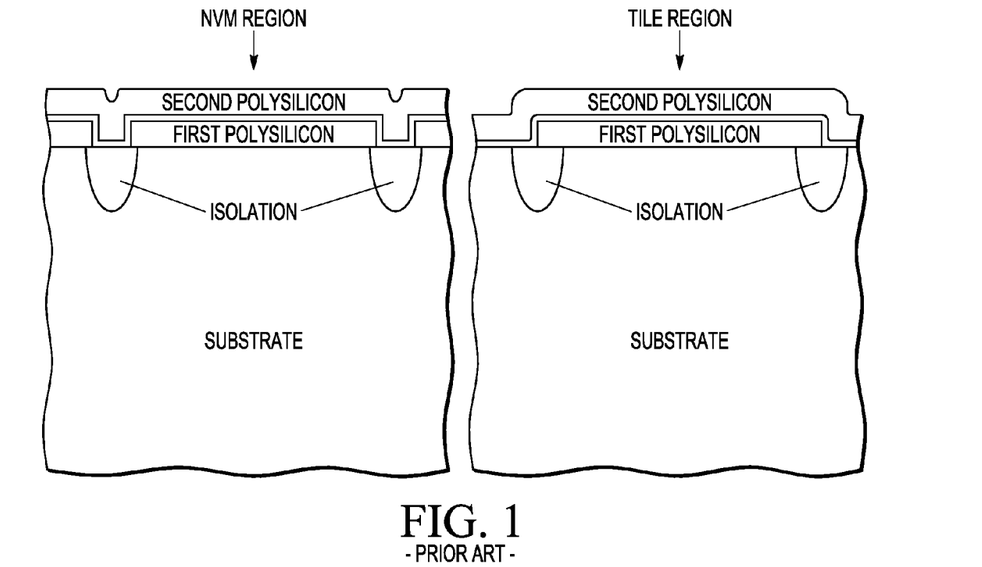
FIG. 1 illustrates a cross-sectional view of an integrated circuit having an NVM region and a tile region at a stage in processing, in accordance with the prior art.
Figure 2:
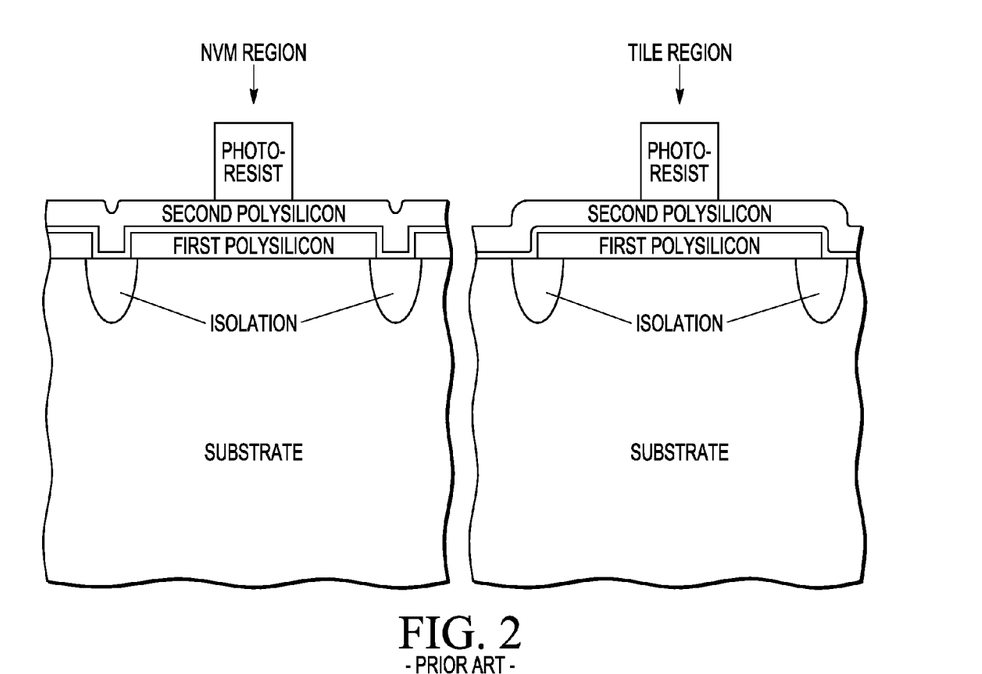
FIG. 2 illustrates a cross-section view of the integrated circuit of FIG. 1 at a subsequent stage in processing, in accordance with the prior art.
Figure 3:
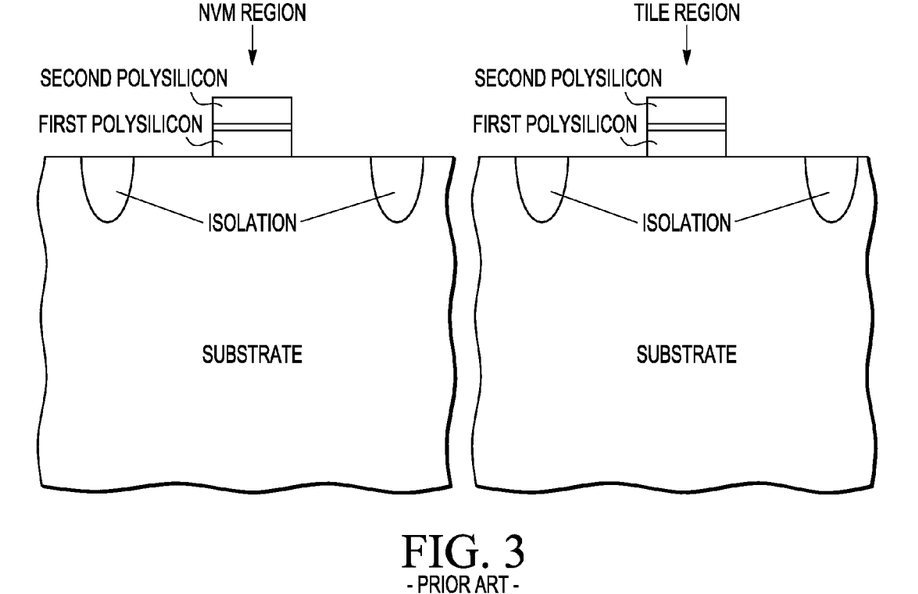
FIG. 3 illustrates a cross-section view of the integrated circuit of FIG. 2 at a subsequent stage in processing, in accordance with the prior art.

FIGS. 1-3 illustrate cross-sectional views of various stages during the formation of an integrated circuit having an NVM region and a tile region, in accordance with the prior art. Referring to FIG. 1, a first polysilicon layer is formed over the substrate in both the NVM region and the tile region. The first polysilicon layer is patterned such that a portion remains between the isolation regions in each of the NVM and tile regions. Subsequently, a dielectric layer is formed over the first polysilicon layer in both the NVM and tile regions, and a second polysilicon layer is formed over the dielectric layer in both the NVM and tile regions. In FIG. 2, a photoresist layer is formed over the second polysilicon layer and patterned, wherein the remaining portions of the photoresist layer correspond to a gate stack in the NVM region and a tile feature (also referred to as a dummy feature or fill feature) in the tile region. Each of the first polysilicon layer, dielectric layer, and the second dielectric layer is simultaneously etched, using the patterned photoresist layer, in the NVM region and the tile region. Therefore, referring to FIG. 3, the simultaneous etching in the NVM region and the tile region result in the formation of a gate stack in the NVM region having a portion of the first polysilicon layer and the second polysilicon layer and a tile feature in the tile region having both a portion of the first polysilicon layer and the second polysilicon layer. The tile feature in the tile region is formed over the substrate, between the isolation regions and not on the isolation regions. The simultaneous etching of the tile feature in the tile region at the same time as the gate stack in the NVM region provides additional material for use in end point detection during the gate stack etch. Note that the resulting tile feature is not electrically active.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a gate edge diode is formed in a diode region of an integrated circuit during formation of an NVM gate stack in an NVM region of the integrated circuit. The gate edge diode includes a plurality of fingers which include the same layers of material as the NVM gate stack so as to simulate the NVM gate stack. During an etch of the NVM gate stack, the fingers of the gate edge diode are also etched so that the etches of both the NVM gate stack and fingers occur and end at the same time. This may allow for improved end point detection of the NVM gate stack etch due to increased volume of the material being etched.

Figure 4:
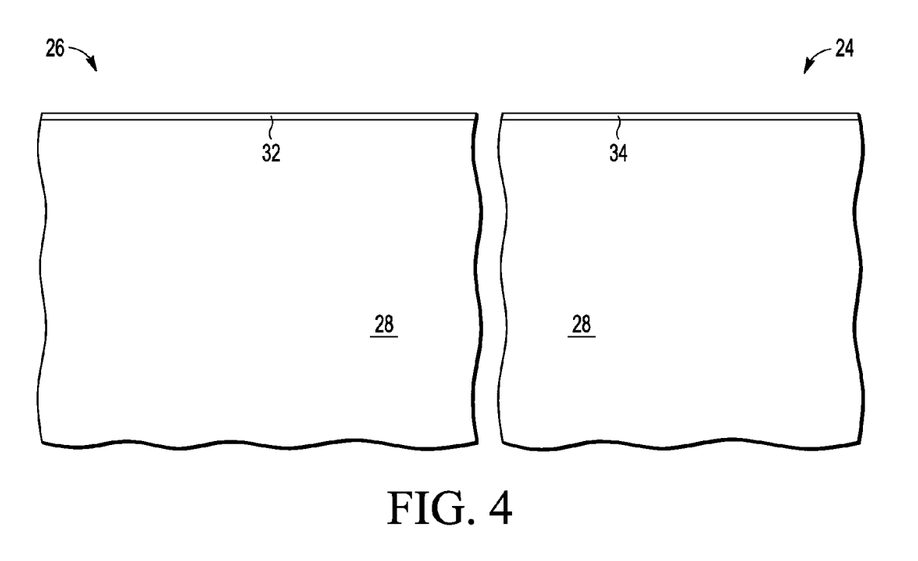
FIG. 4 illustrates a cross-sectional view of an integrated circuit having an NVM region and a diode region at a stage in processing, in accordance with an embodiment of the present invention.

Shown in FIG. 4 in a cross-sectional view of an integrated circuit having a diode region (the left portion) and an NVM region (the right portion). FIG. 4 illustrates gate edge diode 26 (in the left portion) and NVM stack 24 (in the right portion) at an early stage in processing. Included in FIG. 4 is a substrate 28 and a gate dielectric 32 over substrate 28 in the diode region and a gate dielectric 34 over substrate 28 in the NVM region. Substrate 28 can be any semiconductor material or combinations of materials, such as gallium arsenide, silicon germanium, silicon-on-insulator (SOI), silicon, monocrystalline silicon, the like, and combinations of the above.

Figure 5:
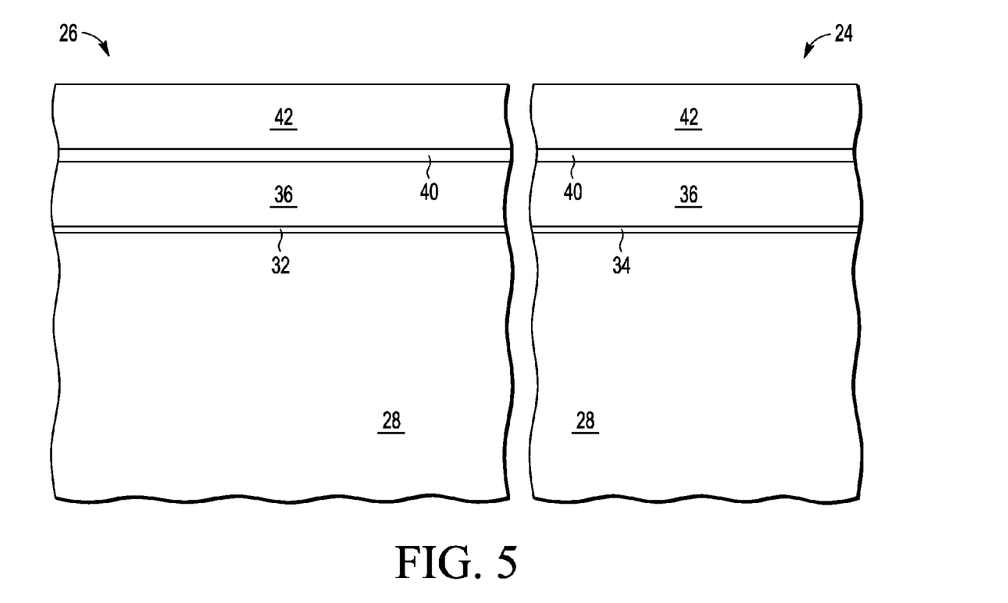
FIG. 5 illustrates a cross-sectional view of the NVM region and the diode region of FIG. 4 at a subsequent stage in processing, in accordance with an embodiment of the present invention.

Shown in FIG. 5 are gate edge diode 26 and NVM gate stack 24 in cross section form after depositing a conductive layer 36 over gate dielectric 32 in the diode region and over gate dielectric 34 the NVM region. In one embodiment, conductive layer 36 is polysilicon and may be formed by a polysilicon deposition. A dielectric layer 40 is formed over conductive layer 36 in both the diode region and the NVM region. In one embodiment, dielectric layer 40 may be formed by sequentially depositing oxide, then nitride, and then oxide. This type of layer may be referenced as an ONO layer. Other dielectrics or combinations of dielectrics may also be used for dielectric layer 40. A conductive layer 42 is formed over dielectric layer 40 in both the diode region and the NVM region. Conductive layer 42 may be polysilicon and may be formed by a polysilicon deposition. For the case of conductive layers 36 and 42 being polysilicon, layer 36 may be referred to as first poly and layer 42 as second poly. Also, in one embodiment, conductive layer 36 may be patterned as needed (which would not be visible in the cross section of FIG. 5) prior to formation of conductive layer 42.

Also, still referring to FIG. 5, after formation of conductive layer 42, a patterned etch may be performed to remove at least a portion of conductive layer 42 and dielectric layer 40 in the diode region to expose an extension portion of conductive layer 36 in the diode region. The removed portion may be located behind the page (behind the cross-sectional view of FIG. 5), and will be seen in reference to the 3-dimensional view of FIG. 10 below.

Figure 6:
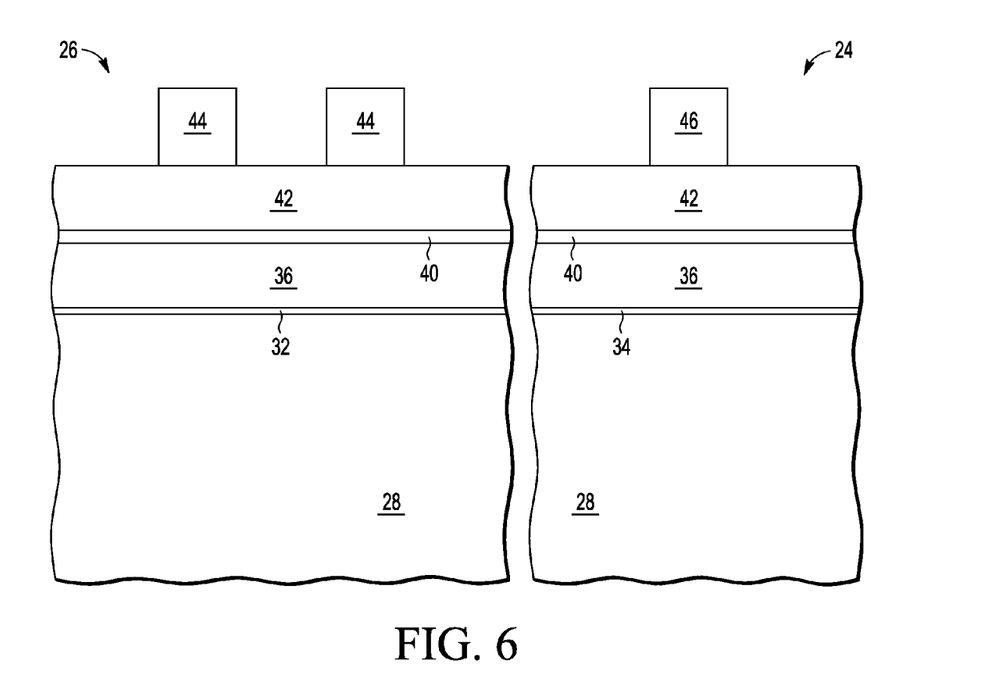
FIG. 6 illustrates a cross-sectional view of the NVM region and the diode region of FIG. 5 at a subsequent stage in processing, in accordance with an embodiment of the present invention.

Shown in FIG. 6 are gate edge diode 26 and NVM gate stack 24 after forming patterned photoresist portion 44 in the diode region where gate edge diode 26 is formed and patterned photoresist portion 46 in the NVM region where NVM gate stack 24 is formed. Patterned photoresist portion 44 defines a pattern of fingers of gate edge diode 26 (as well as a connecting bar which connects the fingers) and patterned photoresist portion 46 defines NVM gate stack 24 of an NVM memory cell. In one embodiment, due to the patterned etch used to expose an extension portion of conductive layer 36 in the diode region, the connecting bar which connects the fingers includes a portion of the exposed extension portion of conductive layer 36 which is not covered by conductive layer 42 or dielectric layer 40.

Figure 7:
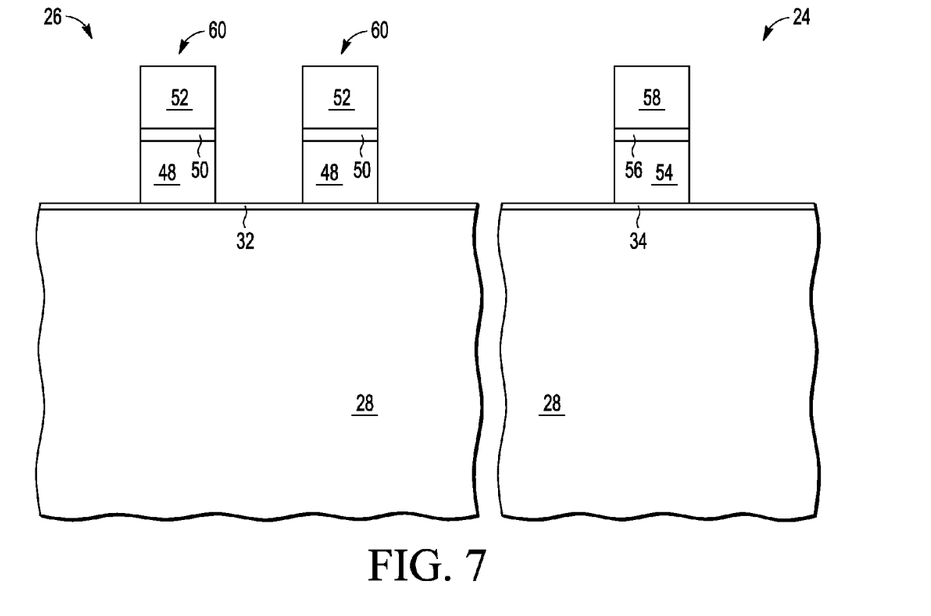
FIG. 7 illustrates a cross-sectional view of the NVM region and the diode region of FIG. 6 at a subsequent stage in processing, in accordance with an embodiment of the present invention.

Shown in FIG. 7 are gate edge diode 26 and NVM gate stack 24 after etching through conductive layer 42, dielectric layer 40, and conductive layer 36 using patterned photoresist portions 44 and 46. This etch results in fingers 60 of gate edge diode 26 having a first conductive layer 48 (formed from conductive layer 36), a dielectric 50 (formed from dielectric layer 40) over first conductive layer 48, and a second conductive layer 52 (formed from conductive layer 42) over dielectric 50. (Note that there is also a connecting bar connecting the fingers not visible in the cross section of FIG. 7 but which will be shown in FIG. 10 below.) This etch also results in NVM gate stack 24 having a first conductive layer 54 (formed from conductive layer 36), a dielectric 56 (formed from dielectric layer 40) over dielectric 56, and a second conductive layer 58 (formed from conductive layer 42) over dielectric 56. During this etch, conductive layers 58 and 54 are patterned to desirably have nearly vertical sidewalls using an anisotropic etch. This etch is ended by detecting that the etch has reached gate dielectric 34 in the NVM region of NVM gate stack 24. A change in the material composition in the etch chamber is detected when the etch is no longer vertically etching polysilicon and is slowly etching gate dielectric 34, which may be grown oxide (which may also be called thermal oxide). Therefore, conductive layer 36 in the diode region provides additional material for detection that the end point of the NVM gate stack etch has been reached.

In an alternate embodiment, the patterned etch described above in reference to FIG. 5 to expose the extension portion of conductive layer 36 is not performed such that, after the etch through conductive layer 42, dielectric layer 40, and conductive layer 36 using photoresist portion 44, a portion of conductive layer 48 is not yet exposed. In this alternate embodiment, after this etch using photoresist portion 44, a patterned etch may be performed to expose a portion of underlying conductive layer 48 so that contact can be made to conductive layer 48.

Figure 8:
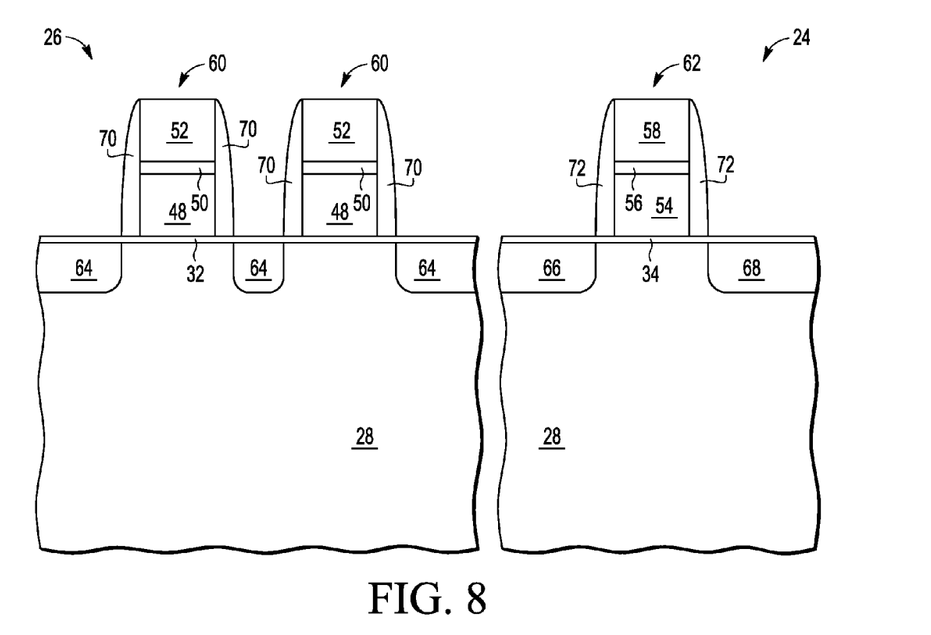
FIG. 8 illustrates a cross-sectional view of the NVM region and the diode region of FIG. 7 at a subsequent stage in processing, in accordance with an embodiment of the present invention.

Shown in FIG. 8, are gate edge diode 26 and NVM gate stack 24 after forming a sidewall spacer 70 along sidewalls of fingers 60 of gate edge diode 26 and a sidewall spacer 72 along sidewalls of NVM gate stack 24. Also, doped regions 64 are formed within substrate 28 laterally adjacent and in between fingers 60 of gate edge diode 26. Also, source/drain regions 66 and 68 are formed laterally adjacent NVM gate stack 24 to form an NVM array bit cell 62. Doped regions 64 and source/drain regions 66 and 68 may be formed by performing an implant using fingers 60 and gate stack 24 as masks. Note that sidewall spacers 70 and 72 may also act as a mask during the implant. Also, first poly may be referred to as a floating gate of the NVM bit cell and the second poly may be referred to as the control gate of the NVM. In one embodiment, after performing the implant, exposed portions of dielectric 32 between and adjacent fingers 60 and exposed portions of dielectric 34 adjacent gate stack 24 may be removed.

Figure 9:
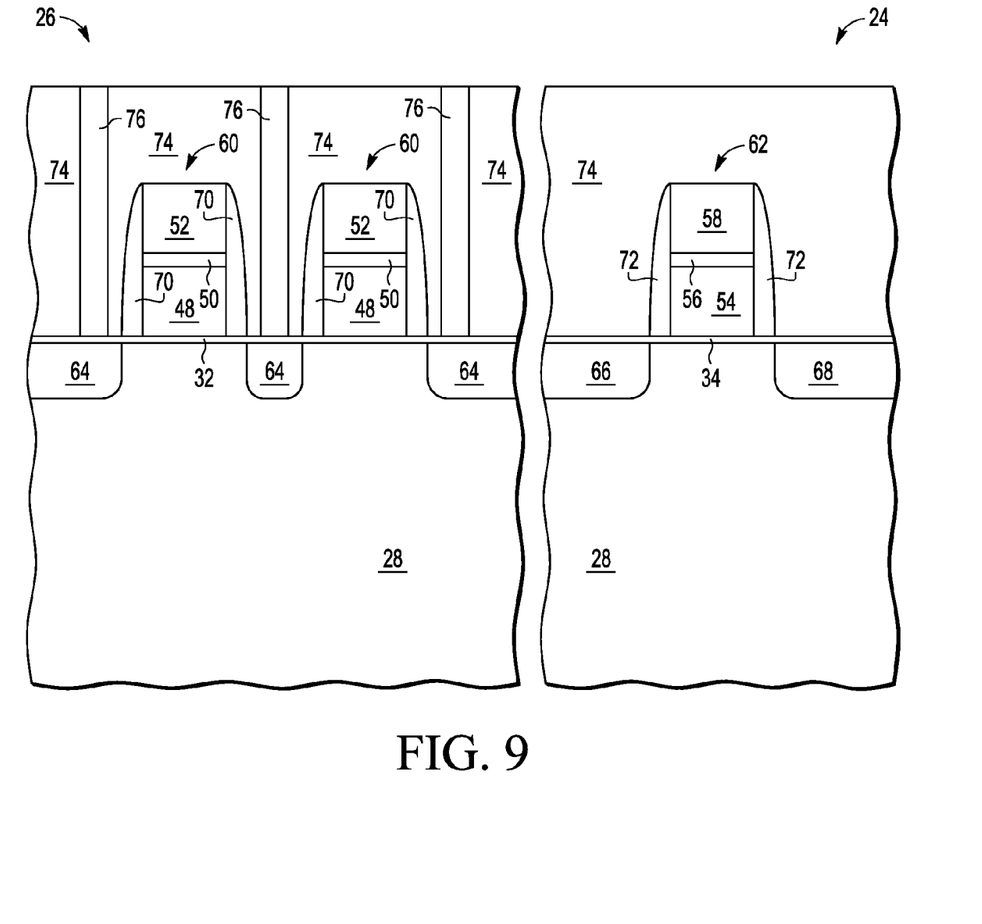
FIG. 9 illustrates a cross-sectional view of the NVM region and the diode region of FIG. 8 at a subsequent stage in processing, in accordance with an embodiment of the present invention.

Shown in FIG. 9, are gate edge diode 26 and NVM gate stack 24 after forming dielectric layer 74 and contacts 76 to doped regions 64 of gate edge diode 26. Note that, in the illustrated cross section, the PN junction of gate edge diode 26 is formed between the doped regions 64 and the well (formed within substrate 28). Also, note that in a direction which is perpendicular to the page of FIG. 9, the PN junction of gate edge diode 26 may be defined by either poly or active edges. The contact to the well in substrate 28, in which doped regions 64 are formed, is not shown since it is not located within the cross section of FIG. 9.

Figure 10:
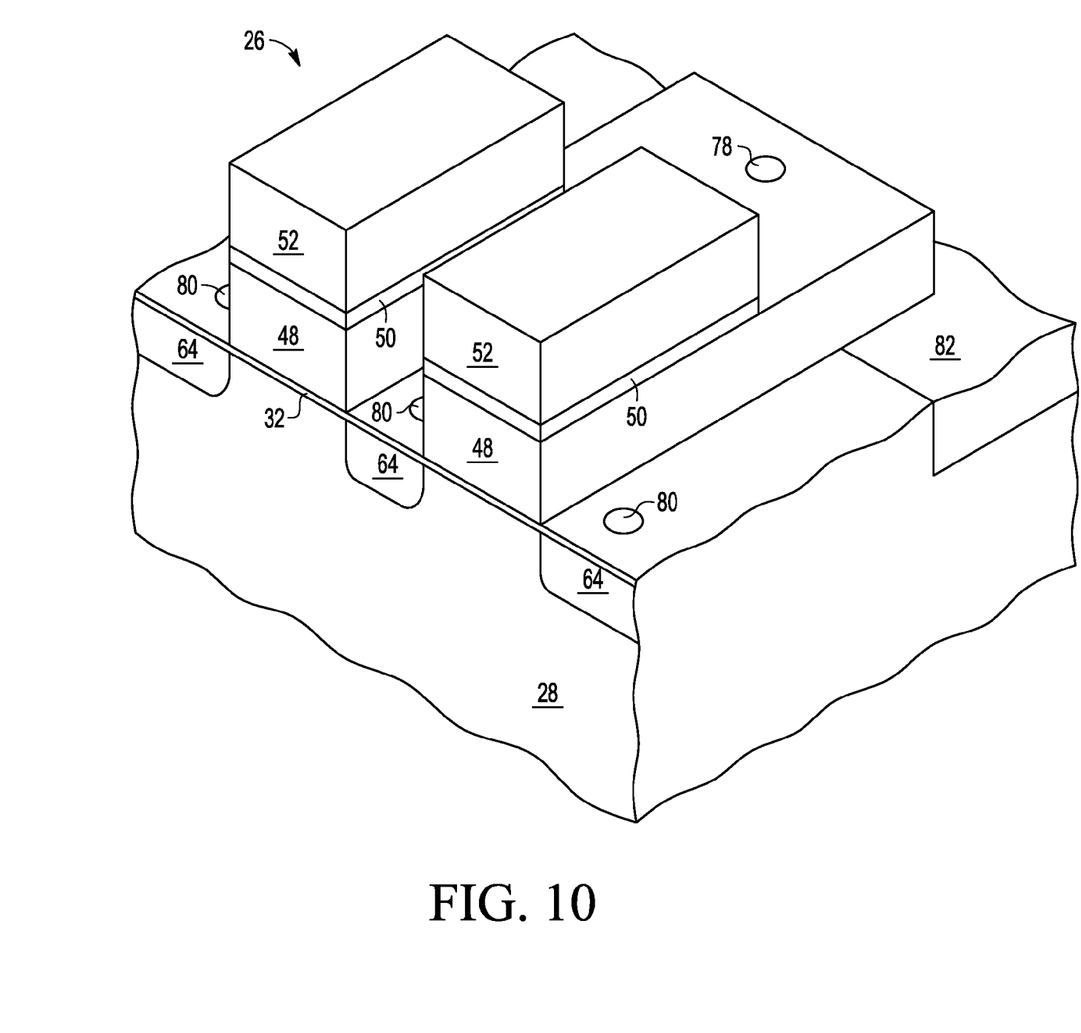
FIG. 10 illustrates a simplified three-dimensional view of the diode region of FIG. 9, in accordance with an embodiment of the present invention.

Shown in FIG. 10 is a three-dimensional view of gate edge diode 26. For ease of illustration, contacts 76 are not shown (instead, their location is indicated by contact locations 80) and sidewall spacer 70 is not shown. Note that, in one embodiment, it may be desirable to make electrical contact with first poly (conductive layer 48) of gate edge diode 26. Therefore, as described above, portions of the second poly (conductive layer 52) may be removed to expose a portion of first poly to allow for a contact (such as at contact location 78) to be formed to the first poly. This exposed poly which remains in FIG. 10 may be referred to as the connecting bar which connects fingers 60. Alternatively, if contact to the first poly is not needed, the second poly and dielectric need not be patterned to expose the first poly. Therefore, the connecting bar may also include a portion of the second poly. Also illustrated in FIG. 10 is an isolation region 82 within substrate 28 and located adjacent doped regions 64. Therefore, note that the fingers of gate edge diode 26 include dielectric layer 50 and second conductive layer 52 over first conductive layer 48. In this manner, the fingers of gate edge diode 26 simulate the gate stack used for the NVM array in the NVM region. Therefore, the fingers of gate edge diode 26 (which include the same stack of materials as NVM gate stack 24) can be simultaneously etched with the etch of NVM gate stack 24 to allow for improved end point detection.

Therefore, by now it should be appreciated that there has been provided a method for improved end point detection during the etch of the NVM gate stack etch by simultaneously etching the fingers of a gate edge diode whose stack of materials mimics the stack of materials present in the NVM gate stack.

Although the invention is described herein with reference to specific embodiments, various modifications and changes can be made without departing from the scope of the present invention as set forth in the claims below. For example, different materials may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of making a gate-edge diode in a diode region of a substrate and a non-volatile memory cell in an NVM region of the substrate, and the method includes forming a first dielectric layer on the substrate in the diode region and the NVM region; forming a first conductive layer on the first dielectric layer; forming a second dielectric layer on the first conductive layer; forming a second conductive layer over the second dielectric layer; forming a first mask over the diode region having a first pattern, wherein the first pattern is of a plurality of fingers and a second mask over the NVM region having a second pattern, wherein the second pattern is of a gate stack of the non-volatile memory cell; performing an etch through the second conductive layer, the second dielectric layer, and the first conductive layer to leave the first pattern of the plurality of fingers in the diode region and the second pattern of the gate stack in the NVM region; and performing an implant using the gate stack and the plurality of fingers as a mask to provide source/drain regions adjacent to the gate stack in the NVM region and diode terminals between the fingers in the diode region to form the gate-edge diode with the diode terminals and the substrate.

Item 2 includes the method of item 1, wherein the step of forming the first mask is further characterized by the first pattern being further of a connecting bar connecting the plurality of fingers and the step of performing the etch leaves the connecting bar. Item 3 includes the method of item 2, and further includes removing the second conductive layer from the connecting bar and leave connecting bar as a portion of the first conductive layer. Item 4 includes the method of item 1, wherein the gate stack comprises a control gate as a portion of the second conductive layer and a floating gate as a portion of the first conductive layer. Item 5 includes the method of item 1, and further includes forming sidewall spacers adjacent to the plurality of fingers and the gate stack. Item 6 includes the method of item 5, wherein the step of performing the implant is further characterized by the sidewalls spacers acting as a mask. Item 7 includes the method of item 1, and further includes removing the first dielectric layer between the fingers and adjacent to the gate stack after the step of performing the implant. Item 8 includes the method of item 1, and further includes forming a contact to the first conductive layer. Item 9 includes the method of item 1, and further includes forming an interlayer dielectric over the gate stack and the plurality of fingers. Item 10 includes the method of item 9, and further includes forming contacts through the interlayer dielectric to the diode terminals.

Item 11 includes a method of making a gate-edge diode in a diode region of a substrate and a non-volatile memory cell in an NVM region of the substrate, and the method includes forming a first dielectric layer on the substrate in the diode region and the NVM region; forming a first conductive layer on the first dielectric layer; forming a second dielectric layer on the first conductive layer; forming a second conductive layer over the second dielectric layer; forming a first mask over the diode region having a first pattern, wherein the first pattern is of a plurality of fingers and a second mask over the NVM region having a second pattern, wherein the second pattern is of a gate stack of non-volatile memory cell; performing an etch through the second conductive layer, the second dielectric layer, and the first conductive layer to leave the first pattern of the plurality of fingers in the diode region and the second pattern of the gate stack in the NVM region; forming sidewall spacers adjacent to the plurality of fingers and the gate stack; and performing an implant using the gate stack, the plurality of fingers, and the sidewall spacers as a mask to provide source/drain regions adjacent to the gate stack in the NVM region and diode terminals between the fingers in the diode region to form the gate-edge diode with the diode terminals and the substrate. Item 12 includes the method of item 11, wherein the step of forming the first mask is further characterized by the first pattern being further of a connecting bar connecting the plurality of fingers and the step of performing the etch leaves the connecting bar. Item 13 includes the method of item 12, and further includes removing the second conductive layer from the connecting bar and leave connecting bar as a portion of the first conductive layer. Item 14 includes the method of item 13, wherein the gate stack comprises a control gate as a portion of the second conductive layer and a floating gate as a portion of the first conductive layer. Item 15 includes the method of item 14, and further includes removing the first dielectric layer between the fingers and adjacent to the gate stack after the step of performing the implant.

Item 16 includes a method of making a gate-edge diode in a diode region of a substrate and a non-volatile memory cell in an NVM region of the substrate, and the method includes forming a first dielectric layer on the substrate in the diode region and the NVM region; forming a polysilicon layer on the first dielectric layer; forming a second dielectric layer on the polysilicon layer; forming a conductive layer over the second dielectric layer; forming a first mask over the diode region having a first pattern, wherein the first pattern is of a plurality of fingers and a second mask over the NVM region having a second pattern, wherein the second pattern is of a gate stack of the non-volatile memory cell; performing an etch through the conductive layer, the second dielectric layer, and the polysilicon layer to leave the first pattern of the plurality of fingers in the diode region and the second pattern of the gate stack in the NVM region; and performing an implant using the gate stack and the plurality of fingers as a mask to provide source/drain regions adjacent to the gate stack in the NVM region and diode terminals between the fingers in the diode region to form the gate-edge diode with the diode terminals and the substrate. Item 17 includes the method of item 16, and further includes forming sidewall spacers adjacent to the plurality of fingers and the gate stack, wherein the step of performing the implant is further characterized by the sidewalls spacers acting as a mask. Item 18 includes the method of item 17, and further includes removing the first dielectric layer between the fingers and adjacent to the gate stack after the step of performing the implant. Item 19 includes the method of item 18, and further includes performing a patterned etch of the polysilicon layer prior to the step of forming the conductive layer. Item 20 includes the method of item 19, and further includes forming an interlayer dielectric over the gate stack and the plurality of fingers; and forming contacts through the interlayer dielectric to the diode terminals.

What is claimed is:

1. A method of making a gate-edge diode in a diode region of a substrate and a non-volatile memory cell in an NVM region of the substrate, comprising:
    forming a first dielectric layer on the substrate in the diode region and the NVM region;
    forming a first conductive layer on the first dielectric layer;
    forming a second dielectric layer on the first conductive layer;
    forming a second conductive layer over the second dielectric layer;
    forming a first mask over the diode region having a first pattern, wherein the first pattern is of a plurality of fingers and a second mask over the NVM region having a second pattern, wherein the second pattern is of a gate stack of the non-volatile memory cell;
    performing an etch through the second conductive layer, the second dielectric layer, and the first conductive layer to leave the first pattern of the plurality of fingers in the diode region and the second pattern of the gate stack in the NVM region; and
    performing an implant using the gate stack and the plurality of fingers as a mask to provide source/drain regions adjacent to the gate stack in the NVM region and diode terminals between the fingers in the diode region to form the gate-edge diode with the diode terminals and the substrate.

2. The method of claim 1, wherein the step of forming the first mask is further characterized by the first pattern being further of a connecting bar connecting the plurality of fingers and the step of performing the etch leaves the connecting bar.

3. The method of claim 2, further comprising removing the second conductive layer from the connecting bar and leave connecting bar as a portion of the first conductive layer.

4. The method of claim 1, wherein the gate stack comprises a control gate as a portion of the second conductive layer and a floating gate as a portion of the first conductive layer.

5. The method of claim 1, further comprising forming sidewall spacers adjacent to the plurality of fingers and the gate stack.

6. The method of claim 5, wherein the step of performing the implant is further characterized by the sidewalls spacers acting as a mask.

7. The method of claim 1, further comprising removing the first dielectric layer between the fingers and adjacent to the gate stack after the step of performing the implant.

8. The method of claim 1, further comprising forming a contact to the first conductive layer.

9. The method of claim 1, further comprising forming an interlayer dielectric over the gate stack and the plurality of fingers.

10. The method of claim 9, further comprising forming contacts through the interlayer dielectric to the diode terminals.

11. A method of making a gate-edge diode in a diode region of a substrate and a non-volatile memory cell in an NVM region of the substrate, comprising:
    forming a first dielectric layer on the substrate in the diode region and the NVM region;
    forming a first conductive layer on the first dielectric layer;
    forming a second dielectric layer on the first conductive layer;
    forming a second conductive layer over the second dielectric layer;
    forming a first mask over the diode region having a first pattern, wherein the first pattern is of a plurality of fingers and a second mask over the NVM region having a second pattern, wherein the second pattern is of a gate stack of non-volatile memory cell;
    performing an etch through the second conductive layer, the second dielectric layer, and the first conductive layer to leave the first pattern of the plurality of fingers in the diode region and the second pattern of the gate stack in the NVM region;
    forming sidewall spacers adjacent to the plurality of fingers and the gate stack; and
    performing an implant using the gate stack, the plurality of fingers, and the sidewall spacers as a mask to provide source/drain regions adjacent to the gate stack in the NVM region and diode terminals between the fingers in the diode region to form the gate-edge diode with the diode terminals and the substrate.

12. The method of claim 11, wherein the step of forming the first mask is further characterized by the first pattern being further of a connecting bar connecting the plurality of fingers and the step of performing the etch leaves the connecting bar.

13. The method of claim 12, further comprising removing the second conductive layer from the connecting bar and leave connecting bar as a portion of the first conductive layer.

14. The method of claim 13, wherein the gate stack comprises a control gate as a portion of the second conductive layer and a floating gate as a portion of the first conductive layer.

15. The method of claim 14, further comprising removing the first dielectric layer between the fingers and adjacent to the gate stack after the step of performing the implant.

16. A method of making a gate-edge diode in a diode region of a substrate and a non-volatile memory cell in an NVM region of the substrate, comprising:
    forming a first dielectric layer on the substrate in the diode region and the NVM region;
    forming a polysilicon layer on the first dielectric layer;
    forming a second dielectric layer on the polysilicon layer;
    forming a conductive layer over the second dielectric layer;

forming a first mask over the diode region having a first pattern, wherein the first pattern is of a plurality of fingers and a second mask over the NVM region having a second pattern, wherein the second pattern is of a gate stack of the non-volatile memory cell;

performing an etch through the conductive layer, the second dielectric layer, and the polysilicon layer to leave the first pattern of the plurality of fingers in the diode region and the second pattern of the gate stack in the NVM region; and performing an implant using the gate stack and the plurality of fingers as a mask to provide source/drain regions adjacent to the gate stack in the NVM region and diode terminals between the fingers in the diode region to form the gate-edge diode with the diode terminals and the substrate.

17. The method of claim 16, further comprising forming sidewall spacers adjacent to the plurality of fingers and the gate stack, wherein the step of performing the implant is further characterized by the sidewalls spacers acting as a mask.

18. The method of claim 17, further comprising removing the first dielectric layer between the fingers and adjacent to the gate stack after the step of performing the implant.

19. The method of claim 18, further comprising performing a patterned etch of the polysilicon layer prior to the step of forming the conductive layer.

20. The method of claim 19, further comprising:
forming an interlayer dielectric over the gate stack and the plurality of fingers; and
forming contacts through the interlayer dielectric to the diode terminals.

* * * * *